United States Patent
Zojaji et al.

(10) Patent No.: US 8,093,154 B2
(45) Date of Patent: Jan. 10, 2012

(54) ETCHANT TREATMENT PROCESSES FOR SUBSTRATE SURFACES AND CHAMBER SURFACES

(75) Inventors: Ali Zojaji, Santa Clara, CA (US); Arkadii V. Samoilov, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 834 days.

(21) Appl. No.: 11/242,613

(22) Filed: Oct. 3, 2005

(65) Prior Publication Data

US 2006/0169669 A1   Aug. 3, 2006

Related U.S. Application Data

(63) Continuation-in-part of application No. 11/047,323, filed on Jan. 31, 2005, now Pat. No. 7,235,492.

(51) Int. Cl.
*H01L 21/302* (2006.01)
*H01L 21/461* (2006.01)

(52) U.S. Cl. ........ 438/706; 438/707; 438/710; 438/719; 134/1; 134/1.1; 134/1.2; 134/1.3

(58) Field of Classification Search .................. None
See application file for complete search history.

(56) References Cited

U.S. PATENT DOCUMENTS

| | | | |
|---|---|---|---|
| 4,663,831 A * | 5/1987 | Birrittella et al. ............ | 438/348 |
| 4,834,831 A | 5/1989 | Nishizawa et al. | |
| 5,028,560 A * | 7/1991 | Tsukamoto et al. .......... | 438/482 |
| 5,112,439 A | 5/1992 | Reisman et al. | |
| 5,129,958 A * | 7/1992 | Nagashima et al. ......... | 134/22.1 |
| 5,273,930 A | 12/1993 | Steele et al. | |
| 5,288,658 A | 2/1994 | Ishihara | |
| 5,294,286 A | 3/1994 | Nishizawa et al. | |
| 5,308,788 A | 5/1994 | Fitch | |
| 5,372,860 A | 12/1994 | Fehlner et al. | |

(Continued)

FOREIGN PATENT DOCUMENTS

EP   1 150 345   10/2001

(Continued)

OTHER PUBLICATIONS

Wolf et al., Silicon Processing for the VLSI Era, vol. 1, 1986, p. 542-558.*

(Continued)

*Primary Examiner* — Duy Deo
(74) *Attorney, Agent, or Firm* — Patterson & Sheridan, L.L.P.

(57) ABSTRACT

In one embodiment of the invention, a method for finishing or treating a silicon-containing surface is provided which includes removing contaminants and/or smoothing the surface contained on the surface by a slow etch process (e.g., about <100 Å/min). The silicon-containing surface is exposed to an etching gas that contains an etchant and a silicon source. Preferably, the etchant is chlorine gas so that a relatively low temperature (e.g., <800° C.) is used during the process. In another embodiment, a method for etching a silicon-containing surface during a fast etch process (e.g., about >100 Å/min) is provided which includes removing silicon-containing material to form a recess in a source/drain (S/D) area on the substrate. In another embodiment, a method for cleaning a process chamber is provided which includes exposing the interior surfaces with a chamber clean gas that contains an etchant and a silicon source. The chamber clean process limits the etching of quartz and metal surfaces within the process chamber.

25 Claims, 5 Drawing Sheets

U.S. PATENT DOCUMENTS

| | | | |
|---|---|---|---|
| 5,374,570 A | 12/1994 | Nasu et al. | |
| 5,469,806 A | 11/1995 | Mochizuki et al. | |
| 5,480,818 A | 1/1996 | Matsumoto et al. | |
| 5,503,875 A | 4/1996 | Imai et al. | |
| 5,521,126 A | 5/1996 | Okamura et al. | |
| 5,527,733 A | 6/1996 | Nishizawa et al. | |
| 5,674,304 A | 10/1997 | Fukada et al. | |
| 5,693,139 A | 12/1997 | Nishizawa et al. | |
| 5,796,116 A | 8/1998 | Nakata et al. | |
| 5,807,792 A | 9/1998 | Ilg et al. | |
| 5,906,680 A | 5/1999 | Meyerson | |
| 5,908,307 A | 6/1999 | Talwar et al. | |
| 5,916,365 A | 6/1999 | Sherman | |
| 5,983,906 A * | 11/1999 | Zhao et al. | 134/1.1 |
| 6,025,627 A | 2/2000 | Forbes et al. | |
| 6,042,654 A | 3/2000 | Comita et al. | |
| 6,124,158 A | 9/2000 | Dautartas et al. | |
| 6,144,060 A | 11/2000 | Park et al. | |
| 6,159,852 A | 12/2000 | Nuttall et al. | |
| 6,200,893 B1 | 3/2001 | Sneh | |
| 6,207,487 B1 | 3/2001 | Kim et al. | |
| 6,232,196 B1 | 5/2001 | Raaijmakers et al. | |
| 6,270,572 B1 | 8/2001 | Kim et al. | |
| 6,284,646 B1 | 9/2001 | Leem | |
| 6,284,686 B1 | 9/2001 | Marlor | |
| 6,287,965 B1 | 9/2001 | Kang et al. | |
| 6,291,319 B1 | 9/2001 | Yu et al. | |
| 6,303,476 B1 | 10/2001 | Hawryluk et al. | |
| 6,305,314 B1 | 10/2001 | Sneh et al. | |
| 6,335,280 B1 | 1/2002 | van der Jeugd | |
| 6,342,277 B1 | 1/2002 | Sherman | |
| 6,348,420 B1 | 2/2002 | Raaijmakers et al. | |
| 6,352,945 B1 | 3/2002 | Matsuki et al. | |
| 6,358,829 B2 | 3/2002 | Yoon et al. | |
| 6,383,955 B1 | 5/2002 | Matsuki et al. | |
| 6,383,956 B2 | 5/2002 | Hawryluk et al. | |
| 6,387,761 B1 | 5/2002 | Shih et al. | |
| 6,391,785 B1 | 5/2002 | Satta et al. | |
| 6,391,803 B1 | 5/2002 | Kim et al. | |
| 6,399,491 B2 | 6/2002 | Jeon et al. | |
| 6,410,463 B1 | 6/2002 | Matsuki | |
| 6,451,119 B2 | 9/2002 | Sneh et al. | |
| 6,458,718 B1 | 10/2002 | Todd | |
| 6,462,367 B2 | 10/2002 | Marsh et al. | |
| 6,468,924 B2 | 10/2002 | Lee et al. | |
| 6,489,241 B1 | 12/2002 | Thilderkvist et al. | |
| 6,492,283 B2 | 12/2002 | Raaijmakers et al. | |
| 6,511,539 B1 | 1/2003 | Raaijmakers | |
| 6,534,395 B2 | 3/2003 | Werkhoven et al. | |
| 6,544,900 B2 | 4/2003 | Raaijmakers et al. | |
| 6,559,520 B2 | 5/2003 | Matsuki et al. | |
| 6,562,720 B2 | 5/2003 | Thilderkvist et al. | |
| 6,580,104 B1 * | 6/2003 | U'Ren | 257/205 |
| 6,620,670 B2 | 9/2003 | Song et al. | |
| 6,630,413 B2 | 10/2003 | Todd | |
| 6,632,279 B1 | 10/2003 | Ritala et al. | |
| 6,635,588 B1 | 10/2003 | Hawryluk et al. | |
| 6,645,838 B1 | 11/2003 | Talwar et al. | |
| 6,797,558 B2 | 9/2004 | Nuttall et al. | |
| 6,821,825 B2 | 11/2004 | Todd et al. | |
| 2001/0000866 A1 | 5/2001 | Sneh et al. | |
| 2001/0020712 A1 | 9/2001 | Raaijmakers et al. | |
| 2001/0024387 A1 | 9/2001 | Raaijmakers et al. | |
| 2001/0024871 A1 | 9/2001 | Yagi | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0046567 A1 | 11/2001 | Matsuki et al. | |
| 2001/0055672 A1 | 12/2001 | Todd | |
| 2002/0000598 A1 | 1/2002 | Kang et al. | |
| 2002/0016084 A1 | 2/2002 | Todd | |
| 2002/0019148 A1 | 2/2002 | Hawryluk et al. | |
| 2002/0022294 A1 | 2/2002 | Hawryluk et al. | |
| 2002/0031618 A1 | 3/2002 | Sherman | |
| 2002/0047151 A1 | 4/2002 | Kim et al. | |
| 2002/0060363 A1 | 5/2002 | Xi et al. | |
| 2002/0074588 A1 | 6/2002 | Lee | |
| 2002/0076837 A1 | 6/2002 | Hujanen et al. | |
| 2002/0090818 A1 | 7/2002 | Thilderkvist et al. | |
| 2002/0093042 A1 | 7/2002 | Oh et al. | |
| 2002/0098627 A1 | 7/2002 | Pomarede et al. | |
| 2002/0117399 A1 | 8/2002 | Chen et al. | |
| 2002/0145168 A1 | 10/2002 | Bojarczuk et al. | |
| 2002/0155722 A1 | 10/2002 | Satta et al. | |
| 2002/0168868 A1 | 11/2002 | Todd | |
| 2002/0172768 A1 | 11/2002 | Endo et al. | |
| 2002/0173113 A1 | 11/2002 | Todd | |
| 2002/0173130 A1 | 11/2002 | Pomerede et al. | |
| 2002/0197831 A1 | 12/2002 | Todd et al. | |
| 2002/0197881 A1 | 12/2002 | Ramdani et al. | |
| 2003/0013320 A1 | 1/2003 | Kim et al. | |
| 2003/0015764 A1 | 1/2003 | Raaijmakers et al. | |
| 2003/0022528 A1 | 1/2003 | Todd | |
| 2003/0032281 A1 | 2/2003 | Werkhoven et al. | |
| 2003/0036268 A1 | 2/2003 | Brabant et al. | |
| 2003/0045074 A1 | 3/2003 | Seibel et al. | |
| 2003/0049942 A1 | 3/2003 | Haukka et al. | |
| 2003/0060057 A1 | 3/2003 | Raaijmakers et al. | |
| 2003/0072884 A1 | 4/2003 | Zhang et al. | |
| 2003/0072975 A1 | 4/2003 | Shero et al. | |
| 2003/0082300 A1 | 5/2003 | Todd et al. | |
| 2003/0089308 A1 | 5/2003 | Raaijmakers | |
| 2003/0089942 A1 | 5/2003 | Bhattacharyya | |
| 2003/0101927 A1 | 6/2003 | Raaijmakers | |
| 2003/0106490 A1 | 6/2003 | Jallepally et al. | |
| 2003/0108674 A1 | 6/2003 | Chung et al. | |
| 2003/0116804 A1 | 6/2003 | Visokay et al. | |
| 2003/0124262 A1 | 7/2003 | Chen et al. | |
| 2003/0129826 A1 | 7/2003 | Werkhoven et al. | |
| 2003/0143841 A1 | 7/2003 | Yang et al. | |
| 2003/0160277 A1 | 8/2003 | Bhattacharyya | |
| 2003/0166318 A1 | 9/2003 | Zheng et al. | |
| 2003/0172872 A1 | 9/2003 | Thakur et al. | |
| 2003/0173586 A1 | 9/2003 | Moriwaki et al. | |
| 2003/0185980 A1 | 10/2003 | Endo | |
| 2003/0186561 A1 | 10/2003 | Law et al. | |
| 2003/0188682 A1 | 10/2003 | Tois et al. | |
| 2003/0189208 A1 | 10/2003 | Law et al. | |
| 2003/0189232 A1 | 10/2003 | Law et al. | |
| 2003/0190423 A1 | 10/2003 | Yang et al. | |
| 2003/0190497 A1 | 10/2003 | Yang et al. | |
| 2003/0194853 A1 | 10/2003 | Jeon | |
| 2003/0198754 A1 | 10/2003 | Xi et al. | |
| 2003/0213560 A1 | 11/2003 | Wang et al. | |
| 2003/0215570 A1 | 11/2003 | Seutter et al. | |
| 2003/0216981 A1 | 11/2003 | Tillman | |
| 2003/0232554 A1 | 12/2003 | Blum et al. | |
| 2003/0235961 A1 | 12/2003 | Metzner et al. | |
| 2004/0007747 A1 | 1/2004 | Visokay et al. | |
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0023462 A1 | 2/2004 | Rotondaro et al. | |
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0053484 A1 | 3/2004 | Kumar et al. | |
| 2004/0226911 A1 | 11/2004 | Dutton et al. | |
| 2004/0253776 A1 | 12/2004 | Hoffmann et al. | |
| 2005/0079691 A1 | 4/2005 | Kim et al. | |

FOREIGN PATENT DOCUMENTS

| | | |
|---|---|---|
| GB | 2 355 727 | 5/2001 |
| JP | 58-098917 | 6/1983 |
| JP | 62-171999 | 7/1987 |
| JP | 63-062313 | 3/1988 |
| JP | 01-143221 | 6/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05-251339 | 9/1993 |
| JP | 06-196809 | 7/1994 |
| JP | 07-300649 | 11/1995 |
| JP | 2001-111000 | 4/2001 |

| | | |
|---|---|---|
| JP | 2001-189312 | 5/2001 |
| JP | 2001-172767 | 6/2001 |
| WO | WO 98/20524 | 5/1998 |
| WO | WO 00/16377 | 3/2000 |
| WO | WO 01/15220 | 3/2000 |
| WO | WO 00/54320 | 9/2000 |
| WO | WO 01/17692 | 3/2001 |
| WO | WO 01/29893 | 4/2001 |
| WO | WO 01/40541 | 6/2001 |
| WO | WO 01/41544 | 6/2001 |
| WO | WO 01/66832 | 9/2001 |
| WO | WO 01/71787 | 9/2001 |
| WO | WO 02/43115 | 5/2002 |
| WO | WO 02/45167 | 6/2002 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

Bedair "Atomic Layer Epitaxy Deposition Processes," J. Vac. Sci. Technol. B., vol. 12, No. 1, Jan./Feb. 1994.

Choi, et al. "Stability of $TiB_2$ as a Diffusion Barrier on Silicon," J. Electrochem. Soc., vol. 138, No. 10, Oct. 1991.

Choi, et al. "The Effect of Annealing on Resistivity of Low Pressure Chemical Vapor Deposited Titanium Diboride," J. Appl. Phys. 69(11), Jun. 1, 1991.

Debusschere, et al. "Importance of determining the polysilicon dopant profile during process development," J. Vac. Sci. Technol. B 14(1), Jan./Feb. 1996.

Derbyshire, K. "Applications of Integrated Processing," Solid State Technology, Dec. 1994 pp. 45-48.

Earles, et al. "Nonmelt Laser Annealing of 5-KeV and 1-KeV Boron-Implanted Silicon," IEEE Transactions on Electron Devices, vol. 49, No. 7, Jul. 2002.

Elers, et al. "$NbCl_5$ as a Precursor in Atomic Layer Epitaxy," Applied Surface Science 82/83 (1994) pp. 468-474.

George, et al. "Surface Chemistry for Atomic Layer Growth," J. Phys. Chem. 1996, 100, pp. 13121-13131.

Goto, et al. "Ultra-Low Contact Resistance for Deca-nm MOSFETs by Laser Annealing", Electron Devices Meeting, 1999. IEDM Technical Digest. International Washington, DC, USA Dec. 5-8, 1999, Piscataway, NJ, USA, IEEE, US, Dec. 5, 1999 (Dec. 2, 1999), pp. 931-933, XP010372206.

Hwang, et al. "Nanometer-Size $\alpha$-$PbO_2$-Type $TiO_2$ in Garnet: A Thermobarometer for Ultrahigh-Pressure Metamorphism," Science Vo. 288 (Apr. 14, 2000) pp. 321-324.

International Search Report mailed Feb. 22, 2005 for PCT/US2004/030872.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Kamins, et al. "Kinetics of selective epitaxial deposition of $Si_{1-x}Ge_x$,", Applied Physics Letters, American Institute pf Physics. New York, US, vol. 61, No. 6, Aug. 10, 1992, pp. 669-671.

Lee, et al. "Cyclic Technique for the Enhancement of Highly Oriented Diamond Film Growth," Thin Solid Films 303 (1997) pp. 264-269.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Min, et al. "Chemical Vapor Deposition of Ti-Si-N. Films with Alternating Source Supply," Mat. Res. Soc. Symp. Proc. vol. 564 (1999) pp. 207-210.

Min, et al. "Metal-organic Atomic-layer Deposition of Titanium-silicon-nitride Films," Applied Physics Letters, vol. 75, No. 11 (Sep. 11, 1999) pp. 1521-1523.

Paranjpe, et al. "Atomic Layer Deposition of $AlO_x$ for Thin Film Head Gap Applications," J. Electrochem. Soc., vol. 148, No. 9, Sep. 2001 pp. G465-G471.

Ritala, et al. "Atomic Layer Deposition of Oxide Thin Films with Metal Alkoxides as Oxygen Sources," Science vol. 288 Apr. 14, 2000 pp. 319-321.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Talwar, et al. "Junction sealing using lasers for thermal annealing," Solid State Technology, vol. 46, Issue 7, Jul. 2003.

Uchino, et al. "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Yamshita, et al. "Kinetics of Boron Activation by Flash Lamp Annealing," Extend Abstracts of the 2003 International Conference of Solid State Devices and Materials, Tokyo, 2003, pp. 742-743.

Kenichi, Ishi, et al., "Low Temperature Pretreatment in Chemical Vapor Deposition of a Silicon Film for Solid-Phase Epitaxial Growth", Japanese Journal of Applied Physics, vol. 27, No. 10, Oct. 1, 1988, pp. L1983-L1985.

Extended European Search Report for EP 06 71 9626, dated Mar. 10, 2008, consist of 10 pages.

Official Letter dated Sep. 25, 2009, from Chinese Patent Office for corresponding Chinese Patent application 200680010817.0.

* cited by examiner

ETCHANT TREATMENT PROCESSES FOR SUBSTRATE SURFACES AND CHAMBER SURFACES

CROSS-REFERENCE TO RELATED APPLICATIONS

This application is a continuation-in-part of U.S. Ser. No. 11/047,323 (APPM/009793), filed Jan. 31, 2005, and issued as U.S. Pat. No. 7,235,492, which is herein incorporated by reference.

BACKGROUND OF THE INVENTION

1. Field of the Invention

Embodiments of the invention generally relate to the field of electronic manufacturing processes and devices, more particular, to methods of etching and depositing silicon-containing materials while forming electronic devices.

2. Description of the Related Art

Electronic devices such as semiconductor devices are fabricated by an assortment of steps including the deposition and removal of silicon-containing materials. The deposition and removal steps as well as other process steps may cause the substrate surface containing a silicon-containing material to become rough and/or bare contaminants. Also, particulates and other contaminants accumulate on the interior surfaces within a process chamber during the deposition and removal steps. The particulates may eventually further contaminate the substrate surface. Rough or contaminated substrate surfaces generally lead to poor quality interfaces which provide poor device performance and reliability.

Etching processes have been developed to combat contaminants and roughness on substrate surfaces. However, the traditional etching processes have some draw backs. Usually, etchants, such as hydrogen chloride (HCl), require a high activation temperature in order to remove silicon-containing materials. Therefore, etching processes are often conducted at temperatures of 1,000° C. or higher. Such high temperatures are not desirable during a fabrication process due to thermal budget considerations, possible uncontrolled nitridation reactions or over-etching to the substrate surface and loss of economically efficiencies. Etching processes with such extreme conditions may damage interior surfaces within the chamber, such as thermal quartz liners. Chlorine ($Cl_2$) has been used to remove silicon-containing materials during etch processes at lower temperatures than processes that utilize hydrogen chloride etchants. However, chlorine reacts very quickly with silicon-containing materials and thus the etch rate is not easily controllable. Therefore, silicon-containing materials are usually over etched by processes using chlorine gas.

Also, traditional etching processes generally are conducted in an etching chamber or a thermal processing chamber. Once the etching of the silicon-containing material is complete, the substrate is transferred into a secondary chamber for a subsequent deposition process. Often, the substrate is exposed to the ambient environment between the etching process and the deposition process. The ambient environment may introduce water and/or oxygen to the substrate surface forming an oxide layer.

Prior to the etching process or the deposition process, a substrate is usually exposed to a pre-treatment process including a wet clean process (e.g., a HF-last process), a plasma clean or an acid wash process. After a pre-treatment process and prior to starting an etching process, the substrate may have to reside outside the process chamber or controlled environment for a period of time called the queue time (Q-time). During the Q-time, the substrate is exposed to ambient environmental conditions that include oxygen and water at atmospheric pressure and room temperature. The ambient exposure forms an oxide layer on the substrate surface, such as silicon oxide. Generally, longer Q-times form thicker oxide layers and therefore more extreme etching processes must be conducted at higher temperatures and pressures to maintain throughput.

Therefore, there is a need to have an etching process for treating a silicon-containing material on a substrate surface to remove any surface contaminants contained thereon and/or to smooth the substrate surface. There is also a need to be able to treat the substrate surface within a process chamber which could subsequently be used during the next process step, such as to deposit an epitaxy layer. Furthermore, there is a need to maintain the process temperature at a low temperature, such as below 1,000° C., and preferably below 800° C., even for substrates that have endured long Q-times (e.g., about 10 hours). Also, there is a need to reduce particulate accumulation on the interior surfaces of a process chamber, while not damaging these interior surfaces.

SUMMARY OF THE INVENTION

In one embodiment, a method for finishing or treating a silicon-containing surface is provided which includes smoothing the surface and removing contaminants contained on the surface. In one example, a substrate is placed into a process chamber and heated to a temperature within a range from about 500° C. to about 700° C. The substrate is heated and exposed to an etching gas containing an etchant, a silicon source and a carrier gas. Chlorine gas ($Cl_2$) may be selected as the etchant so that a relatively low temperature is used during the etching process. A silicon source is usually provided simultaneously with the etchant in order to counter act any over-etching caused by the etchant. That is, the silicon source is used to deposit silicon on the silicon-containing layer while the etchant removes the silicon. The rates at which the etchant and the silicon source are exposed to the substrate are adjusted so that the overall reaction favors material removal and/or redistribution. Therefore, in one example, the etch rate may be finely controlled (e.g., several angstroms or less per minute) while removing a silicon-containing during an over-all reaction. In another example, silicon-containing material is removed from higher portions of the surface (i.e., peaks) while added to the lower portions of the surface (i.e., troughs) during a redistribution process. A silicon-containing surface with a surface roughness of about 6 nm root mean square (RMS) or more may be transformed into a much smoother surface with a surface roughness of less than about 0.1 nm RMS.

In another embodiment, a method for etching a silicon-containing surface is provided which includes removing silicon-containing material at a fast rate in order to form a recess in a source/drain (S/D) area on the substrate. In another example, a substrate is placed into a process chamber and heated to a temperature within a range from about 500° C. to about 800° C. While the substrate is heated, the silicon-containing surface contained thereon is exposed to an etching gas containing an etchant and a carrier gas. Chlorine gas may be selected as an etchant so that a relatively low temperature is used during the etching process while maintaining a fast etch rate. The etching gas used during a fast etch rate process usually contains no silicon sources or a low concentration of a silicon source. The silicon source may be added to the etching gas to have additional control of the removal rate.

In another embodiment, a process chamber is cleaned during a chamber clean process by exposing the interior surfaces of the process chamber to an etching gas to remove particulates and other contaminants. The interior surfaces usually contain a silicon-containing material (e.g., quartz) that may be damaged during an etchant clean process. Therefore, besides an etchant and a carrier gas, the etching gas may further contain a silicon source to counter act any over-etching caused by the etchant. In one example, a chamber clean gas contains chlorine gas and silane. A carrier gas, such as nitrogen, may be combined with the etchant, the silicon source or both. Generally, the process chamber is heated to a higher temperature during a chamber clean process than during either a slow etch process or a fast etch process. In one example, the process chamber may be heated to a temperature within a range from about 700° C. to about 1,000° C. during a chamber clean process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide processes for etching and depositing silicon-containing materials on substrate surfaces. In one embodiment, a slow etch process (e.g., <100 Å/min) and fast etch process (e.g., >100 Å/min) utilizes an etchant and a silicon source within the etching gas. In another embodiment, the process chamber is exposed to an etching gas during a chamber clean step for removing deposits or contaminants from the interior surfaces. In another embodiment, a process chamber is cleaned during a chamber clean process by exposing the interior surfaces of the process chamber to an etching gas to remove particulates and other contaminants.

Slow Etch Process (Pre-Clean and Smooth)

A slow etch process (e.g., <100 Å/min) may be conducted to remove contaminants and surface irregularities, such as roughness, from a substrate surface. In one aspect, the substrate surface may be etched to expose an underlayer free or substantially free of contaminants. In another aspect, material of the substrate surface may be redistributed to minimize or remove peaks and troughs that attribute to surface irregularities. During the slow etch process, the substrate is exposed to an etching gas containing an etchant, a silicon source and an optional carrier gas. The overall reaction may be controlled in part by manipulating the relative flow rates of the etchant and the silicon source, using a specific etchant source and a silicon source and by adjusting the temperature and the pressure.

The substrate may be exposed to a pre-treatment process to prepare the substrate surface for the subsequent etching process. A pre-treatment process may include a wet clean process, such as a HF-last process, a plasma clean, an acid wash process or combinations thereof. In one example, the substrate is treated with a HF-last wet clean process by exposing the surface to a hydrofluoric acid solution (e.g., about 0.5 wt % HF in water) for a duration of about 2 minutes.

Figure 1:
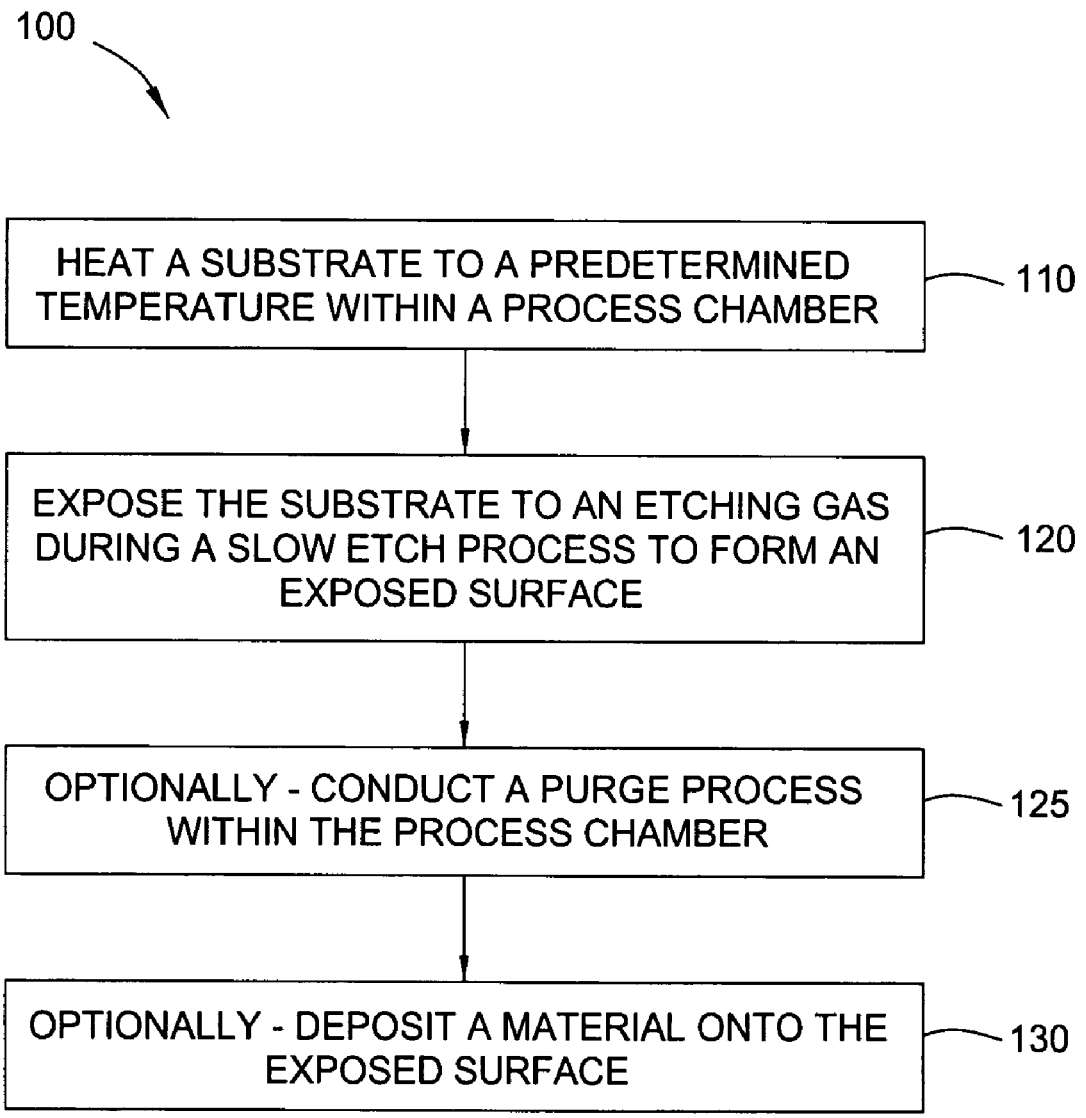
FIG. 1 is a flow chart depicting a process for treating a silicon-containing material by one embodiment described herein.
Figure 2A:
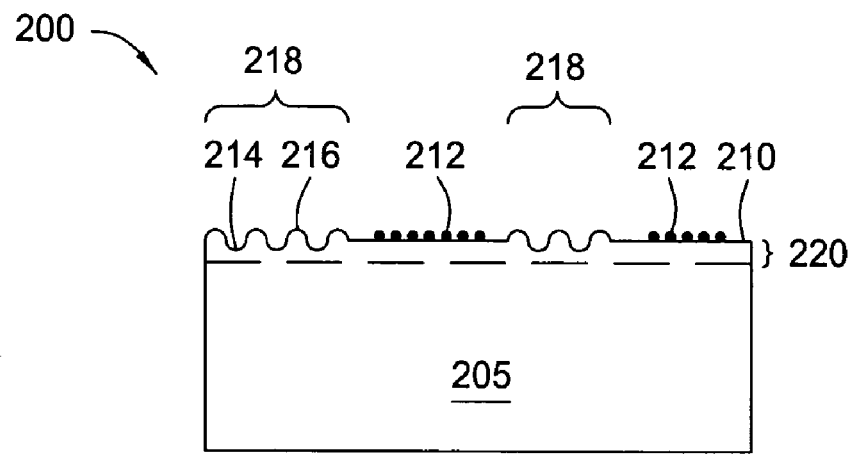
FIGS. 2A-2C show schematic illustrations of a substrate at different stages during a process described herein.
Figure 2B:
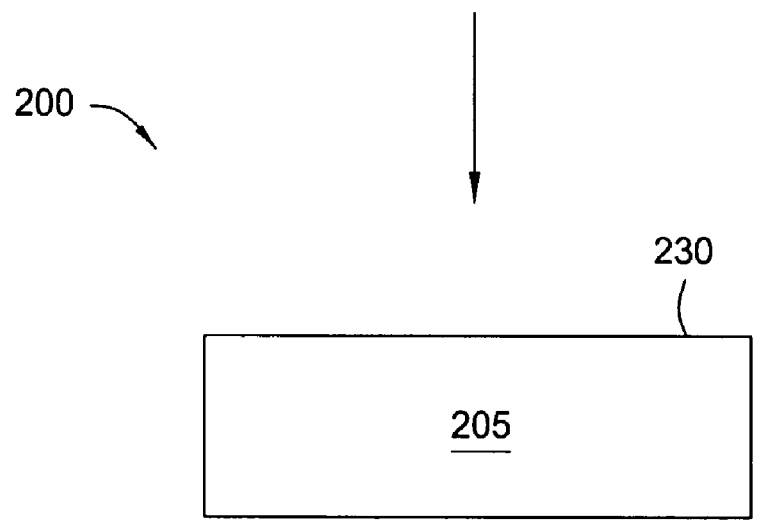
Figure 2C:
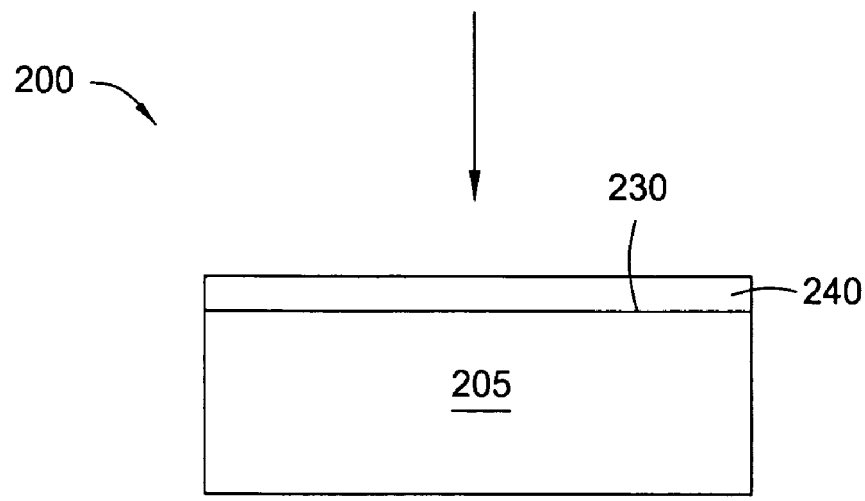

FIG. 1 illustrates a flow chart depicting process 100 for removing contaminants 212 and rough areas 218 from substrate 200 that is graphically illustrated by FIG. 2A. Substrate 200 contains silicon-containing layer 205 and surface 210. Contaminants 212 and rough areas 218 are contained on and in surface 210. Rough areas 218 may be formed by peaks 216 and troughs 214 within surface 210. A predetermined thickness 220 of material from silicon-containing layer 205 may be removed during the slow etch process to reveal exposed surface 230 (FIG. 2B). Subsequently, layer 240 may be formed on exposed surface 230 during an optional deposition process (FIG. 2C). In one example, layer 240 contains a silicon-containing material deposited by an epitaxy deposition process.

Embodiments of the invention provide processes to etch and deposit silicon-containing materials on various substrates surfaces and substrates, such as substrates 200 and 400 and layers 205 and 405 (FIGS. 2A-2C and 4A-4C) A "substrate" or "substrate surface" as used herein refers to any substrate or material surface formed on a substrate upon which film processing is performed. For example, a substrate surface on which processing may be performed include materials such as silicon, silicon-containing materials, silicon oxide, strained silicon, silicon on insulator (SOI), carbon doped silicon oxides, silicon nitride, doped silicon, silicon germanium, silicon germanium carbon, germanium, silicon carbon, gallium arsenide, glass, sapphire, and any other materials depending on the application. A substrate surface may also include dielectric materials such as silicon dioxide, silicon nitride, silicon oxynitride and/or carbon doped silicon oxides. Substrates may have various dimensions, such as 200 mm or 300 mm diameter round wafers, as well as, rectangular or square panes. Embodiments of the processes described herein etch and deposit on many substrates and surfaces, especially, silicon and silicon-containing materials. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers silicon nitride and patterned or non-patterned wafers.

Throughout the application, the terms "silicon-containing" materials, compounds, films or layers should be construed to include a composition containing at least silicon and may contain germanium, carbon, boron, arsenic, phosphorous gallium and/or aluminum. Other elements, such as metals, halogens or hydrogen may be incorporated within a silicon-containing material, compound, film or layer, usually with concentrations of about part per million (ppm). Compounds or alloys of silicon-containing materials may be represented by an abbreviation, such as Si for silicon, SiGe, for silicon germanium, SiC for silicon carbon and SiGeC for silicon germanium carbon. The abbreviations do not represent chemical equations with stoichiometrical relationships, nor represent any particular reduction/oxidation state of the silicon-containing materials. Silicon-containing materials, compounds, films or layers may include substrates or substrate surfaces.

Contaminants 212 on surface 210 include organic residues, carbon, oxides, nitrides, halides (e.g., fluorides or chlorides) or combinations thereof. For example, surface 210 may contain a layer of silicon oxide after being exposed to the ambient air or may contain a layer of silicon fluoride after being treated with a HF-last wet clean process. Surface 210 may also contain irregularities or regional areas of roughness, such as troughs 214 and peaks 216 within rough areas 218.

Substrate 200 may be positioned within a process chamber and heated to a predetermined temperature (step 110). The substrate and the process chamber may be heated completely or a portion thereof to temperature within a range from about 300° C. to about 800° C., preferably, from about 500° C. to about 700° C., and more preferably, from about 550° C. to about 650° C. The process chamber may be maintained at a pressure within a range from about 1 mTorr to about 760 Torr, preferably, from about 0.1 Torr to about 500 Torr, and more preferably, from about 1 Torr to about 100 Torr.

In one embodiment, a cold wall reactor is used as a process chamber for processes conducted at lower temperatures. A cold wall reactor may provide temperature control of each independent portion within the reactor, such as reactor walls, reactor dome and substrate susceptor. Usually, the reactor dome may be formed from quartz. In one example, the cold wall reactor may have reactor walls maintained at a temperature less than about 400° C., preferably, less than about 200° C., and more preferably, less than about 150° C., a reactor dome maintained at a temperature within a range from about 300° C. to about 800° C., preferably, from about 400° C. to about 700° C., and more preferably, from about 500° C. to about 600° C., and a substrate susceptor maintained at a temperature within a range from about 300° C. to about 800° C., preferably, from about 500° C. to about 700° C., and more preferably, from about 550° C. to about 650° C.

The etching gas used during the slow etch process (step 120) contains an etchant, a silicon source and an optional carrier gas. The etchant, the silicon source and the carrier gas may be premixed, co-flowed or independently flowed into the process chamber. In one aspect, the etchant and a carrier gas are either co-flowed or combined together as a gas mixture, the silicon source and a carrier gas are either co-flowed or combined together as a gas mixture and the two gas mixtures may be co-flowed together prior to entering the process chamber. For example, a gas mixture of chlorine and nitrogen may be co-flowed into the process chamber with a mixture of silane and nitrogen. In another example, a gas mixture of chlorine and nitrogen may be co-flowed into the process chamber with a mixture of silane and hydrogen.

Preferably, the etchant is chlorine gas ($Cl_2$). In one example, it has been found that chlorine works exceptionally well as an etchant for silicon-containing materials at temperatures lower than processes using more common etchants, such as hydrogen chloride. Therefore, an etch process utilizing chlorine may be conducted at a lower process temperature. The silicon source may be administered simultaneously with the etchant in order to counter act any over-etching of susceptible surfaces on substrate 200. The silicon source is used to deposit silicon on the silicon-containing layer while the etchant removes the silicon-containing material. The rates at which the etchant and the silicon source are exposed to the substrate are adjusted so that the overall reaction favors material removal and/or material redistribution. Therefore, the overall reaction is removing or redistributing silicon-containing material and the etch rate may be finely controlled to several angstroms per minute.

The etchant is usually administered into the process chamber at a rate within a range from about 1 standard cubic centimeters per minute (sccm) to about 1 standard liters per minute (slm), preferably, from about 5 sccm to about 150 sccm, and more preferably, from about 10 sccm to about 30 sccm, for example, about 20 sccm. While chlorine is the preferred etchant, other etchants that may be used solely or in combination include chlorine trifluoride ($ClF_3$), tetrachlorosilane ($SiCl_4$) or a derivative thereof.

The silicon source is usually provided into the process chamber for slow etch processes at a rate within a range from about 5 sccm to about 500 sccm, preferably, from about 10 sccm to about 100 sccm, and more preferably, from about 20 sccm to about 80 sccm, for example, about 50 sccm. Silicon sources that may be used in the etching include silanes, halogenated silanes, organosilanes or derivatives thereof. Silanes include silane ($SiH_4$) and higher silanes with the empirical formula $Si_xH_{(2x+2)}$, such as disilane ($Si_2H_6$), trisilane ($Si_3H_8$) and tetrasilane ($Si_4H_{10}$), as well as others. Halogenated silanes include compounds with the empirical formula $X'_ySi_xH_{(2x+2-y)}$, where $X'$ is independently selected from F, Cl, Br or I, such as hexachlorodisilane ($Si_2Cl_6$), tetrachlorosilane ($SiCl_4$), trichlorosilane ($Cl_3SiH$), dichlorosilane ($Cl_2SiH_2$) and chlorosilane ($ClSiH_3$). Organosilanes include compounds with the empirical formula $R_ySi_xH_{(2x+2-y)}$, where R is independently selected from methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). The preferred silicon sources include silane, dichlorosilane and disilane.

The carrier gas is usually provided into the process chamber at a flow rate within a range from about 1 slm to about 100 slm, preferably, from about 5 slm to about 80 slm, and more preferably, from about 10 slm to about 40 slm, for example, about 20 slm. Carrier gases may include nitrogen ($N_2$), hydrogen ($H_2$), argon, helium or combinations thereof. In one embodiment, an inert carrier gas is preferred and includes nitrogen, argon, helium or combinations thereof. A carrier gas may be selected based on the precursor(s) used and/or the process temperature of the slow etch process of step 120.

Preferably, nitrogen is utilized as a carrier gas in embodiments featuring low temperature (e.g., <800° C.) processes. Low temperature processes are accessible due in part to the use of chlorine gas in the etching process. Nitrogen remains inert during low temperature etching processes. Therefore, nitrogen is not incorporated into the silicon-containing materials on the substrate during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of subsequently deposited silicon-containing layers. Finally, the low temperature processes may take economic advantage of nitrogen as a carrier gas, since nitrogen is far less expensive than hydrogen, argon or helium. In one example of an etching gas, chlorine is the etchant, silane is the silicon source and nitrogen is the carrier gas.

Substrate 200 and surface 210 may be exposed to a slow etch gas to remove a predetermined thickness 220 of silicon-containing layer 205 during step 120 (FIGS. 2A-2B). Surface 210 is etched during the removal of the predetermined thickness 220. The slow etch gas is exposed to substrate 200 for a time period within a range from about 5 seconds to about 5 minutes, preferably, from about 30 seconds to about 2 minutes. The amount of time is adjusted relative to the etch rate used in a particular process. The etch rate of a slow etch process is usually less than about 100 Å/min, preferably less than about 50 Å/min. In one embodiment, the slow etch rate is within a range from about 2 Å/min to about 20 Å/min, preferably, from about 5 Å/min to about 15 Å/min, for example, about 10 Å/min. In another embodiment, the etch rate is less than about 2 Å/min, preferably less than about 1 Å/min, and more preferably, approaches a redistribution of material on the substrate such that the net removal rate is non-measurable relative to the thickness of the layer. As the etch process is slowed to a redistribution reaction, material of silicon-containing layer 205 may be removed from peaks 216 and added to troughs 214 within surface 210 to form exposed surface 230. Troughs 214 may be filled by the material derived from peaks 216 and/or virgin material being produced by the introduction of precursors (e.g., silicon source) within the slow etch gas.

A slow etch process may be utilized to reduce the surface roughness on substrate 200. In one example, surface 210 with a surface roughness of about 6 nm root mean square (RMS) or more, may be exposed to a slow etch gas to remove material from silicon-containing layer 205 by predetermined thickness 220 to reveal exposed surface 230. Exposed surface 230 may have a surface roughness of about 1 nm RMS or less, preferably, about 0.1 nm RMS or less, and more preferably, about 0.07 nm RMS. Contaminants 212 and rough areas 218 previously disposed on or in surface 210 are removed during process 100. Exposed surface 230 is usually free or substantially free of contaminants that include organic residues, carbon, oxides, nitrides, halides (e.g., fluorides or chlorides) or combinations thereof.

An optional purge process may be performed within the process chamber during step 125 (FIG. 1). The purge process helps remove residual etch gas from substrate 200, which in turn enhances the growth during the subsequent deposition process (step 130). During a low pressure purge process, the process chamber may have an internal pressure within a range from about 0.1 mTorr to about 100 Torr, preferably, from about 1.0 mTorr to about 10 Torr, and more preferably, from about 10.0 mTorr to about 1 Torr. The purge process may be conducted for a time period within a range from about 30 seconds to about 10 minutes, preferably, from about 1 minute to about 5 minutes, and more preferably, from about 2 minutes to about 4 minutes. Generally, all of the gas entering the process chamber may be turned off. However, in an alternative aspect, a purge gas may be administered anytime during the purge process. A purge gas may include nitrogen, hydrogen, argon, helium, forming gas or combination thereof.

Layer 240 may be deposited on exposed surface 230 during step 130. Preferably, layer 240 is a silicon-containing material that may be selectively and epitaxially grown or deposited on exposed surface 230 by a chemical vapor deposition (CVD) process. Chemical vapor deposition processes, as described herein, include many techniques, such as atomic layer epitaxy (ALE), atomic layer deposition (ALD), plasma-assisted CVD (PA-CVD) or plasma-enhanced CVD (PE-CVD), plasma-assisted ALD (PA-ALD) or plasma-enhanced ALD (PE-ALD), atomic layer CVD (ALCVD), organometallic or metal-organic CVD (MOCVD or OMCVD), laser-assisted CVD (LA-CVD), ultraviolet CVD (UV-CVD), hot-wire (HWCVD), reduced-pressure CVD (RP-CVD), ultra-high vacuum CVD (UHV-CVD), derivatives thereof or combinations thereof. In one example, a preferred process utilizes thermal CVD to epitaxially grow or deposit a silicon-containing compound as layer 240 on exposed surface 230.

The deposition gas used during step 130 may also contain at least one secondary elemental source, such as a germanium source and/or a carbon source. The germanium source may be added to the process chamber with the silicon source, etchant and carrier gas to form a silicon-containing compound. Therefore, the silicon-containing compound may contain silicon, SiGe, SiC, SiGeC, doped variants thereof or combinations thereof. Germanium and/or carbon may be added to the silicon-containing material by including germanium source (e.g., germane) or a carbon source (e.g., methylsilane) during the deposition process. The silicon-containing compound may also contain dopants by including a boron source (e.g., diborane), an arsenic source (e.g., arsine) or a phosphorous source (e.g., phosphine) during or after the deposition process. The dopant may be included within the silicon source, etchant and carrier gas to form a silicon-containing compound. Alternatively, the dopant may be added to the silicon-containing material by exposing the substrate to an ion implantation process.

In another example, a CVD process called alternating gas supply (AGS) may be used to epitaxially grow or deposit a silicon-containing compound as layer 240 on exposed surface 230. The AGS deposition process includes a cycle of alternating exposures of silicon-sources and etchants to the substrate surface. An AGS deposition process is further disclosed in commonly assigned and co-pending U.S. Ser. No. 11/001,774, filed Dec. 1, 2004, entitled "Selective Epitaxy Process with Alternating Gas Supply," which is incorporated herein by reference in its entirety for the purpose of describing an AGS process.

Process 100 may be used to etch and deposit silicon-containing materials within the same process chamber. Preferably, the slow etch process (step 120) and the subsequent deposition process (step 130) are performed within the same process chamber to improve throughput, be more efficient, decrease probability of contamination and benefit process synergies, such as common chemical precursors. In one aspect, a slow etch process and a deposition process each utilize the same silicon source, the same etchant and the same carrier gas. For example, an etch gas for a slow etch process may contain silane, chlorine and nitrogen, while a deposition gas for a selective, epitaxial deposition process may also contain silane, chlorine and nitrogen. The concentration ratio of the silicon source and the reductant may be adjusted during the overall process to encourage a particular step. In one example, the concentration ratio of the silicon source and the reductant is increased to promote a deposition step. In another example, the concentration ratio of the silicon source and the reductant is decreased to promote an etch step.

Fast Etch Process

In another embodiment, a fast etch process (e.g., >100 Å/min) may be used to selectively remove a silicon-containing material from a substrate surface. The fast etch process is a selective etch process to remove silicon-containing material while leaving barrier material unscathed. Barrier materials may include silicon nitride, silicon oxide or silicon oxynitride used as spacers, capping layers or mask materials.

Figure 3:
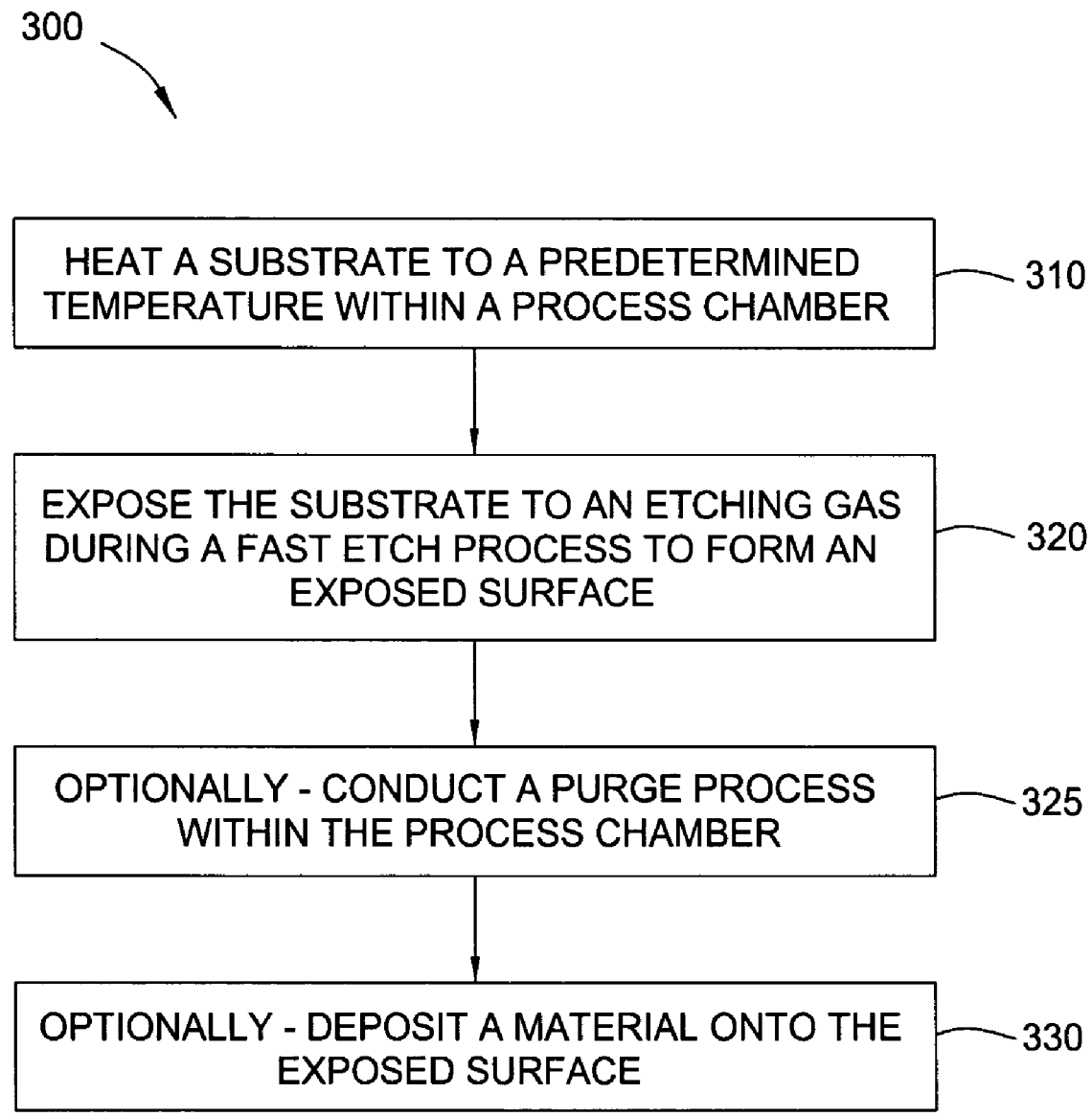
FIG. 3 is a flow chart depicting a process for treating a silicon-containing material by another embodiment described herein.

FIG. 3 illustrates a flow chart depicting process 300 is initiated by positioning the substrate into a process chamber and adjusting the process parameters during step 310. The substrate and the process chamber may be heated completely or a portion thereof to a temperature within a range from about 400° C. to about 800° C., preferably from about 500° C. to about 700° C., and more preferably from about 550° C. to about 650° C. The process chamber is maintained at a pressure within a range from about 1 Torr to about 760 Torr, preferably, from about 0.1 Torr to about 500 Torr, and more preferably, from about 1 Torr to about 100 Torr.

The etching gas used during the fast etch process contains an etchant, a carrier gas and an optional silicon source (step 320). In one example, the etching gas contains chlorine, nitrogen and silane. The etchant may be provided into the process chamber gas at a rate within a range from about 1 sccm to about 100 sccm, preferably from about 5 sccm to about 50 sccm, and more preferably, from about 10 sccm to about 30 sccm, for example, about 20 sccm. While chlorine is the preferred etchant during a fast etch process, other etchants that may be used solely or in combination include chlorine trifluoride, tetrachlorosilane or a derivative thereof.

The carrier gas is usually provided into the process chamber at a flow rate within a range from about 1 slm to about 100 slm, preferably, from about 5 slm to about 80 slm, and more preferably, from about 10 slm to about 40 slm, for example, about 20 slm. Carrier gases may include nitrogen, hydrogen, argon, helium or combinations thereof. In one embodiment, an inert carrier gas is preferred and includes nitrogen, argon, helium or combinations thereof. A carrier gas may be selected based on the precursor(s) used and/or the process temperature during the etching process of step 320. Preferably, nitrogen is used as a carrier gas during embodiments featuring low temperature (e.g., <800° C.) processes. In one example, an etching gas for a first etch process contains chlorine and nitrogen.

In some embodiments, a silicon source may be optionally added to the etching gas for providing additional control of the etch rate during a fast etch process. The silicon source may be delivered into the process chamber at a rate within a range from about 5 sccm to about 500 sccm, preferably, from about 10 sccm to about 100 sccm, and more preferably, from about 20 sccm to about 80 sccm, for example, about 50 sccm. The etching gas may contain a silicon source, such as silanes, halogenated silanes, organosilanes or derivatives thereof, as described above.

Figure 4A:
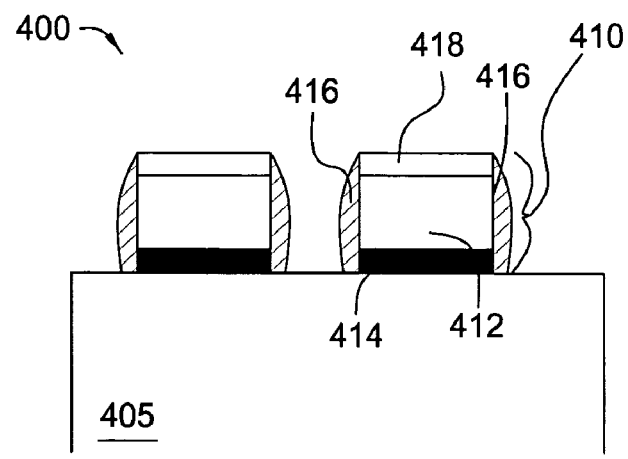
FIGS. 4A-4C show schematic illustrations of another substrate at different stages during a process described herein.

Substrate 400 contains at least one film stack feature 410 (FIG. 4A). Silicon-containing layer 405 may be a doped or undoped, bare silicon substrate or include a silicon-containing layer disposed thereon. Film stack feature 410 includes gate layer 412 on gate oxide layer 414 surrounded by spacers 416 and protective capping layer 418. Generally, gate layer 412 is composed of a polysilicon and gate oxide layer 414 is composed of silicon dioxide, silicon oxynitride or hafnium oxide. Partially encompassing the gate oxide layer 414 is a spacer 416, which is usually an isolation material containing silicon oxide, silicon nitride, silicon oxynitride, derivatives thereof or combinations thereof. In one example, spacer 416 is a nitride/oxide stack (e.g., $Si_3N_4/SiO_2/Si_3N_4$). Gate layer 412 may optionally have a protective capping layer 418 adhered thereon.

Figure 4B:
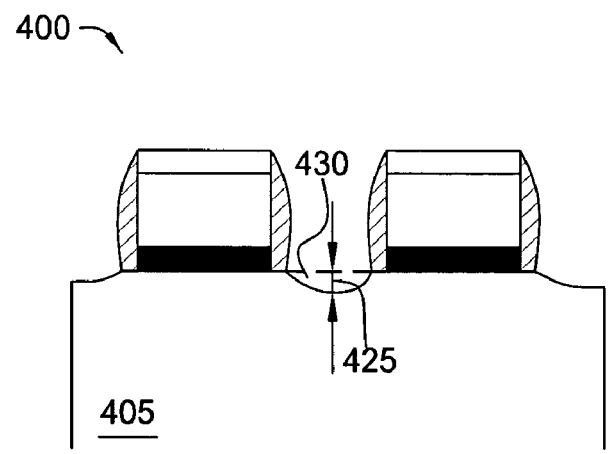

During step 320, substrate 400 is exposed to an etching gas to remove a predetermined thickness 425 of silicon-containing layer 405 and form a recess 430, as depicted in FIG. 4B. The etching gas is exposed to substrate 400 for a time period within a range from about 10 seconds to about 5 minutes, preferably, from about 1 minute to about 3 minutes. The amount of time is adjusted relative to the etch rate used in a particular process. The etch rate of a fast etch process is usually faster than about 100 Å/min, preferably, faster than about 200 Å/min, such as at a rate within a range from about 200 Å/min to about 1,500 Å/min, preferably, from about 200 Å/min to about 1,000 Å/min, for example, about 600 Å/min.

In one example, the etching process may be kept at a fast rate to remove the predetermined thickness 425, and then reduced to a slow rate process to smooth the remaining surface. The reduced etching rate may be controlled by a slow etching process described by process 100.

An optional purge process may be performed within the process chamber during step 325. The purge process helps remove residual etch gas from substrate 400, which in turn enhances the growth during the subsequent deposition process (step 330). During a low pressure purge process, the process chamber may have an internal pressure within a range from about 0.1 mTorr to about 100 Torr, preferably, from about 1.0 mTorr to about 10 Torr, and more preferably, from about 10.0 mTorr to about 1 Torr. The purge process may be conducted for a time period within a range from about 30 seconds to about 10 minutes, preferably, from about 1 minute to about 5 minutes, and more preferably, from about 2 minutes to about 4 minutes. Generally, all of the gas entering the process chamber may be turned off. However, in an alternative aspect, a purge gas may be administered into the process chamber anytime during the purge process.

Figure 4C:
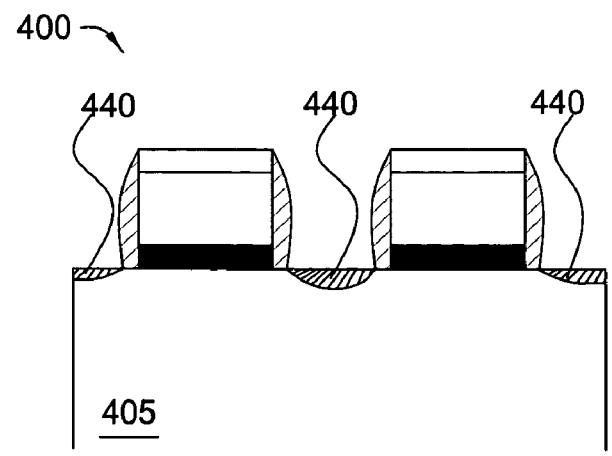

Once the predetermined thickness 425 of substrate 400 is removed, layer 440 may be deposited during step 330 (FIG. 4C). Preferably, layer 440 is a silicon-containing material that may be selectively and epitaxially deposited on the exposed surface of recess 430 a CVD process. In one example, the CVD process includes an AGS deposition technique. Alternatively, recess 430 may be exposed to another fabrication process prior to the deposition of layer 440, such as a doping process. One example of a doping process includes ion implantation, in which a dopant (e.g., boron, phosphorous or arsenic) may be implanted into the surface of the recess 430.

Process 300 may be used to etch and deposit silicon-containing materials in the same process chamber. Preferably, the fast etch process and the subsequent deposition is performed in the same process chamber to improve throughput, be more efficient, decrease probability of contamination and benefit process synergies, such as common chemical precursors. In one example, both the fast etch process and the selective, epitaxial deposition process of a silicon-containing compound use chlorine as an etchant and nitrogen as a carrier gas.

Figure 5:
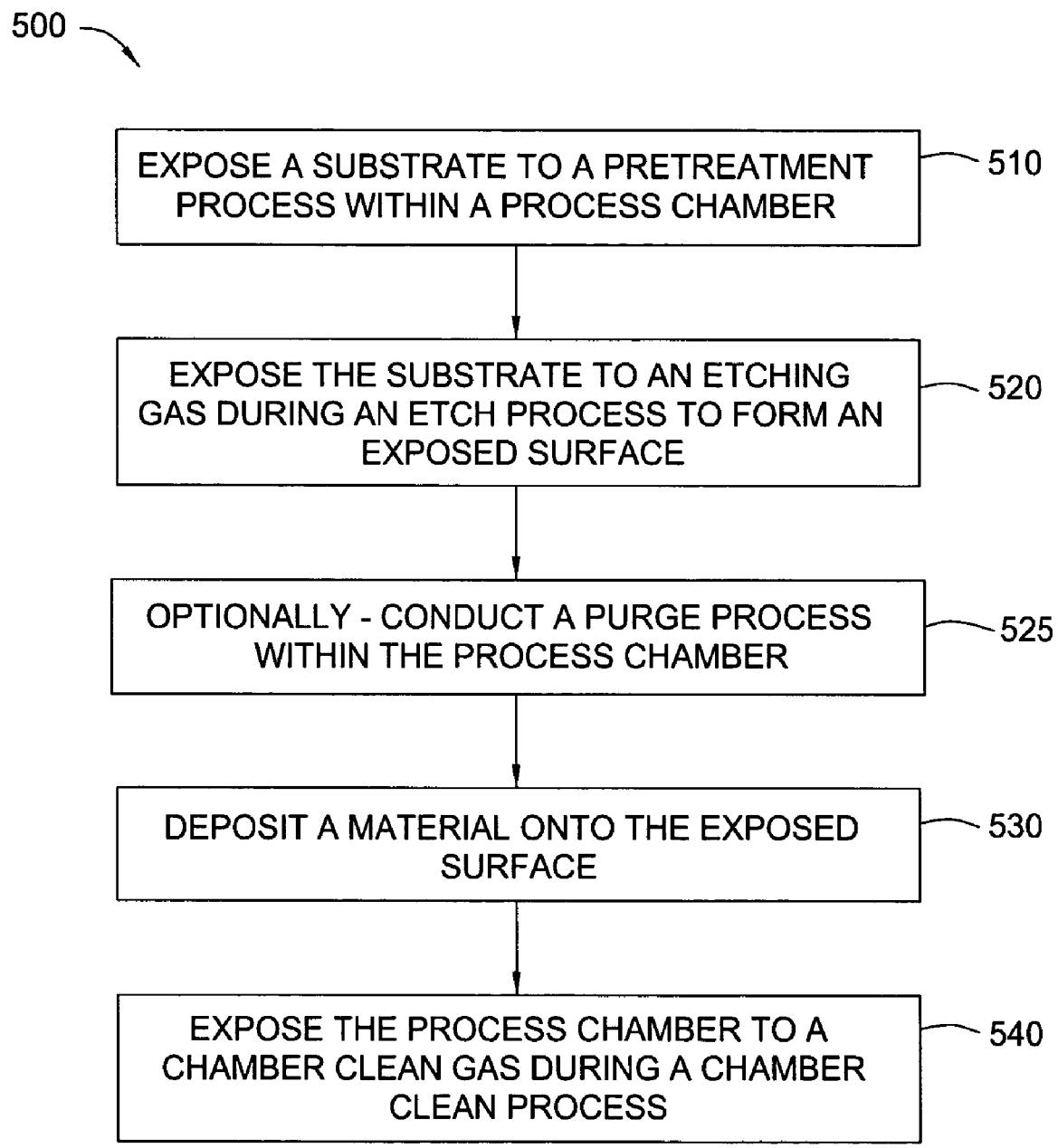
FIG. 5 is a flow chart depicting a process for fabricating substrates and thereafter cleaning the process chamber by another embodiment described herein.

FIG. 5 illustrates an alternative embodiment of the invention that includes cleaning the process chamber after finishing fabrication techniques during process 500. The substrate may be exposed to a pre-treatment process that includes a wet clean process, a HF-last process, a plasma clean, an acid wash process or combinations thereof (step 510). After a pre-treatment process and prior to starting an etching process described herein, the substrate may have to remain outside the controlled environment of the process chamber for a period of time called queue time (Q-time). The Q-time in an ambient environment may last about 2 hours or more, usually, the Q-time last much longer, such as a predetermined time with a range from about 6 hours to about 24 hours or longer, such as about 36 hours. A silicon oxide layer usually forms on the substrate surface during the Q-time due to the substrate being exposed to ambient water and oxygen.

During step 520, the substrate is positioned into a process chamber and exposed to an etching process as described herein. The etching process may be a slow etch process as described in step 120, a fast etch process as described in step 320 or both. The etching process removes a pre-determined thickness of silicon-containing layer from the substrate to form an exposed silicon-containing layer. Subsequently, an optional purge process may be performed within the process chamber (step 525). Thereafter, a secondary material is deposited on the exposed silicon-containing layer (step 530). Usually, the secondary material is in a selective, epitaxially deposited silicon-containing compound. The deposition process may include the processes as described during steps 130 and 330. In one embodiment, processes 100 and 300 may be used during steps 520 and 530.

A chamber clean process is conducted inside the process chamber to remove various contaminants therein (step 540). Etch processes and deposition processes may form deposits or contaminants on surfaces within the process chamber. Usually, the deposits include silicon-containing materials adhered to the walls and other inner surfaces of the process chamber. Therefore, a chamber clean process may be used to remove contaminants while not damaging interior surfaces of the process chamber.

In an example of process 500, the substrate is first exposed to a HF-last process. The substrate is placed into a process chamber and exposed to an etch process that contains chlorine and nitrogen at about 600° C. Thereafter, the process chamber is exposed to a purge process. Subsequently, a silicon-containing layer is epitaxially deposited on the substrate by a deposition process utilizing chlorine and nitrogen at about 625° C. within the same process chamber. Thereafter, the substrate is removed and the process chamber is heated to about 675° C. and exposed to a cleaning gas containing chlorine and nitrogen. Preferably, the etchant and the carrier gas are the same gases used during steps 520 and 540.

Chamber Clean Process

In another embodiment, a chamber clean gas containing a silicon source may be used to remove various contaminants from inside a process chamber during a chamber clean process, such as step 540. The interior surfaces of the process chamber usually contain a silicon-containing material (e.g., quartz) that may be damaged during a traditional etchant clean process. Therefore, besides an etchant and a carrier gas, the chamber clean gas may further contain a silicon source to counter act any over-etching caused by the etchant.

The process chamber may contain an interior surface or components having a surface that is chemically vulnerable to an etchant. Also, the interior surface or componental part within the process chamber may have a protective coating that is vulnerable to an etchant. Generally, these interior surface within the process chamber may contain a silicon-containing surface, such as quartz, silicon oxide, silicon carbide, silicon carbide coated graphite, sapphire, silicide coatings, derivatives thereof or combinations thereof. In other examples, the interior surface is a metal-containing surface within the process chamber, such as steel, stainless steel, iron, nickel, chromium, aluminum, alloys thereof or combinations thereof. The interior surfaces may be on the interior of the walls, floor and lid of the chamber, as well as internal components or portions thereof, such as a susceptor, a linear, an upper dome, a lower dome, a preheat ring, a showerhead, a dispersion plate, a probe or the like.

The cleaning process includes heating the substrate susceptor to a temperature within a range from about 600° C. to about 1,200° C., preferably, from about 650° C. to about 1,000° C., and more preferably, from about 700° C. to about 900° C., for example, about 800° C. The process chamber may have an internal pressure within a range from about 1 mTorr to about 760 Torr, preferably, from about 100 mTorr to about 750 Torr, and more preferably, from about 100 Torr to about 700 Torr, for example, 600 Torr. In one example, a cold wall reactor is used as a process chamber and may have reactor walls maintained at a temperature less than about 400° C., preferably, less than about 200° C., and more preferably, less than about 150° C. and a quartz reactor dome maintained at a temperature within a range from about 300° C. to about 800° C., preferably, from about 400° C. to about 700° C., and more preferably, from about 500° C. to about 600° C.

The cleaning process is conducted for a time period within a range from about 30 seconds to about 10 minutes, preferably, from about 1 minute to about 5 minutes, and more preferably, from about 2 minutes to about 4 minutes. A chamber cleaning gas may contain an etchant, a silicon source and a carrier gas. Preferably, the etchant, the silicon source and the carrier gas used during the chamber cleaning process are the same gases used during a previous fabrication step, such as a slow etch process or a fast etch process. The etchant may be provided into the process chamber during the chamber clean process at a rate within a range from about 10 sccm to about 100 slm, preferably, from about 100 sccm to about 5 slm. In one example, the etchant has a flow rate of about 5 slm, preferably, about 10 slm, and more preferably, about 20 slm. In another example, the etchant has a flow rate of about 50 sccm, preferably, about 130 sccm, and more preferably, about 1,000 sccm. Etchants that may be used within the cleaning gas include chlorine, chlorine trifluoride, tetrachlorosilane, hexachlorodisilane or derivatives thereof.

The silicon source may be provided into the process chamber during the chamber clean process at a rate within a range from about 10 sccm to about 100 slm, preferably, from about 100 sccm to about 5 slm. In one example, the silicon source has a flow rate of about 5 slm, preferably, about 10 slm, and more preferably, about 20 slm. In another example, the silicon source has a flow rate of about 50 sccm, preferably, about 130 sccm, and more preferably, about 1,000 sccm. Silicon sources that may be used in the etching include silanes, halogenated silanes, organosilanes or derivatives thereof. Silanes include silane ($SiH_4$) and higher silanes with the empirical formula $Si_xH_{(2x+2)}$, such as disilane ($Si_2H_6$), trisilane ($Si_3H_8$) and tetrasilane ($Si_4H_{10}$), as well as others. Halogenated silanes include compounds with the empirical formula $X'_ySi_xH_{(2x+2-y)}$, where X' is independently selected from F, Cl, Br or I, such as hexachlorodisilane ($Si_2Cl_6$), tetrachlorosilane ($SiCl_4$), trichlorosilane ($Cl_3SiH$), dichlorosilane ($Cl_2SiH_2$) and chlorosilane ($ClSiH_3$). Organosilanes include compounds with the empirical formula $R_ySi_xH_{(2x+2-y)}$, where R is independently selected from methyl, ethyl, propyl or butyl, such as methylsilane (($CH_3$)$SiH_3$), dimethylsilane (($CH_3$)$_2$$SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Preferred silicon sources include silane, dichlorosilane and disilane.

The carrier gas may be provided into the process chamber during the chamber clean process at a rate within a range from about 100 sccm to about 100 slm. In one example, the carrier gas has a flow rate of about 20 slm, preferably, about 50 slm, and more preferably, about 100 slm. In another example, the carrier gas has a flow rate of about 100 sccm, preferably, about 1 slm, and more preferably, about 10 slm. Carrier gases may include nitrogen, hydrogen, forming gas, argon, helium or combinations thereof. In a preferred example, a chamber clean gas contains chlorine gas, silane and a carrier gas, such as nitrogen. A chamber clean process that may be used within embodiments of the invention described herein is further disclosed in commonly assigned U.S. Pat. No. 6,042,654 and entitled, "Method of Cleaning CVD Cold-Wall Chamber and Exhaust Lines," which is incorporated herein by reference in its entirety. The chamber clean process may be repeated after processing each individual substrate or after multiple substrates. In one example, the chamber clean process is conducted after processing every 25 substrates. In another example, the chamber clean process is conducted after processing every 5 substrates. In another example, the chamber clean process is conducted after processing every 100 substrates. Although a substrate may remain in the process chamber during the chamber clean process, preferably, the substrate is removed and the process is performed on an empty chamber.

Embodiments, as described herein, provide processes that may be utilized during fabrication processes for Metal Oxide Semiconductor Field Effect Transistor (MOSFET) and bipolar transistors, such as Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator and contact plug). Other embodiments provide processes that may be utilized during gate fabrication processes, base contact fabrication processes, collector contact fabrication processes, emitter contact fabrication processes or elevated source/drain fabrication processes.

The processes of the invention may be conducted on fabrication equipment used for ALE, CVD and ALD processes. A system that may be used to etch or deposit the silicon-containing films as described herein include the Epi Centura® system or the Poly Gen® system, both available from Applied Materials, Inc., located in Santa Clara, Calif. A process chamber useful to etch and deposit as described herein is further disclosed in commonly assigned U.S. Pat. No. 6,562,720, and entitled, "Apparatus and Methods for Surface Finishing a Silicon Film," and is incorporated herein by reference in its entirety for the purpose of describing the apparatus. Other enabling apparatuses include batch furnaces and high-temperature furnaces.

EXAMPLES

The following hypothetical examples may be conducted on 300 mm silicon wafers within an Epi Centura® system, available from Applied Materials, Inc., located in Santa Clara, Calif.

Example 1

Pre-Clean Process Comparative without Silane

A substrate was exposed to an HF-last process to form a fluoride terminated surface. The substrate was placed in the process chamber and heated to about 600° C. while the pressure was maintained at about 20 Torr. The substrate was exposed to an etching gas containing $N_2$ at a flow rate of about 20 slm and $Cl_2$ at flow rate of about 120 sccm. The surface was etched at a rate of about 500 Å/min.

Example 2

Pre-Clean Process with Silane

A substrate was exposed to an HF-last process to form a fluoride terminated surface. The substrate was placed in the process chamber and heated to about 600° C. while the pressure was maintained at about 20 Torr. The substrate was exposed to an etching gas containing $N_2$ at a flow rate of about 20 slm, $Cl_2$ at flow rate of about 20 sccm and $SiH_4$ at a flow rate of about 50 sccm. The surface was etched at a rate of about 10 Å/min. Therefore, the addition of a silicon source, such as silane in Example 2, reduced the etch rate of the silicon-containing layer by about 50 times as compared to the etch rate in Example 1.

Example 3

Smoothing Process Comparative without Silane

A substrate surface containing a silicon-containing layer was cleaved forming a surface with a roughness of about 5.5 nm root mean square (RMS). The substrate was placed in the process chamber and heated to about 650° C. while the pressure was maintained at about 200 Torr. The substrate was exposed to an etching gas containing $N_2$ at a flow rate of about 20 slm and $Cl_2$ at flow rate of about 20 sccm. The surface was etched at a rate of about 200 Å/min.

Example 4

Smoothing Process with Silane

A substrate surface containing a silicon-containing layer was cleaved forming a surface with a roughness of about 5.5 nm root mean square. The substrate was placed in the process chamber and heated to about 650° C. while the pressure was maintained at about 200 Torr. The substrate was exposed to an etching gas containing $N_2$ at a flow rate of about 20 slm, $Cl_2$ at flow rate of about 20 sccm and $SiH_4$ at a flow rate of about 50 sccm. The surface was etched at a rate of about 20 Å/min. The surface roughness was reduced to about 0.1 nm RMS. Therefore, the addition of a silicon source, such as silane used in Example 4, reduced the etch rate of the silicon-containing layer by about 10 times as compared to the etch rate in Example 3.

Example 5

Chlorine Etch Process Followed by Silicon-Epitaxy

A silicon substrate contained a series of silicon nitride line features that are about 90 nm tall, about 100 nm wide and about 150 nm apart, baring the silicon surface. The substrate was placed in the process chamber and heated to about 600° C. while the pressure was maintained at about 40 Torr. The substrate was exposed to an etching gas containing $N_2$ at a flow rate of about 20 slm and $Cl_2$ at flow rate of about 80 sccm. The surface was etched at a rate of about 750 Å/min. After about 30 seconds, about 35 nm of the silicon surface was etched. The silicon nitride features remain inert to the etching process. The pressure was increased to about 200 Torr and $SiH_4$ was added to the etching gas at a flow rate of about 50 sccm. The etch rate was reduced to about 18 Å/min to smooth the freshly etched silicon surface. After about 1 minute, the smooth surface is exposed to a selective epitaxy deposition process by increasing the flow of $SiH_4$ to about 100 sccm and maintaining the flow of $N_2$ and $Cl_2$ unchanged. A silicon-containing material was deposited on the silicon surface at a rate of about 25 Å/min.

Example 6

Chlorine Fast Etch Process Containing Silane

A silicon substrate contained a series of silicon nitride line features that are about 90 nm tall, about 100 nm wide and about 150 nm apart, baring the silicon surface. The substrate was placed in the process chamber and heated to about 600° C. while the pressure was maintained at about 40 Torr. The substrate was exposed to an etching gas containing $N_2$ at a flow rate of about 20 slm, Cl$_2$ at flow rate of about 80 sccm and SiH$_4$ at flow rate of about 40 sccm. The surface was etched at a rate of about 400 Å/min.

Example 7

Chamber Clean Process Containing Chlorine and Silane

After a silicon epitaxial deposition process, the substrate was removed from the chamber. The process chamber was heated to about 800° C. while the pressure was adjusted to about 600 Torr. The process chamber was exposed to an etching gas containing N$_2$ at a flow rate of about 20 slm, Cl$_2$ at flow rate of about 2 slm and SiH$_4$ at flow rate of about 1 slm. The chamber clean process was conducted for about 2 minutes.

While the foregoing is directed to embodiments of the invention, other and further embodiments of the invention may be devised without departing from the basic scope thereof, and the scope thereof is determined by the claims that follow.

The invention claimed is:

1. A method for forming a silicon-containing material on a substrate surface, comprising:
 positioning a substrate comprising a silicon material containing a contaminant within a process chamber;
 exposing the substrate to an etching gas comprising chlorine gas and a silicon source at a temperature of less than about 800° C. during an etching process to remove the contaminant;
 exposing the substrate to a deposition gas during a deposition process; and
 exposing the process chamber to a chamber clean gas comprising the chlorine gas and the silicon source during a chamber clean process.

2. The method of claim 1, wherein the substrate is removed from the process chamber prior to starting the chamber clean process.

3. The method of claim 2, wherein the silicon source comprises a reagent selected from the group consisting of silane, disilane, chlorosilane, dichlorosilane, trichlorosilane, hexachlorodisilane, derivatives thereof, and combinations thereof.

4. The method of claim 3, wherein the chamber clean gas further comprises a carrier gas selected from the group consisting of nitrogen, hydrogen, argon, helium, forming gas, and combinations thereof.

5. The method of claim 4, wherein the silicon source comprises silane and the carrier gas comprises nitrogen.

6. The method of claim 3, wherein the process chamber is heated to a temperature of about 600° C. or higher during the chamber clean process.

7. The method of chamber clean process claim 6, wherein the temperature of the process chamber during the is within a range from about 700° C. to about 900° C. and the process chamber is at a pressure of about 760 Torr or less.

8. The method of claim 1, wherein the silicon material further contains a rough surface prior to the etching process, wherein the rough surface has a roughness of greater than 1 nm RMS.

9. The method of claim 8, wherein the rough surface is removed during the etching process to form a smooth surface having a roughness of about 1 nm RMS or less.

10. The method of claim 2, wherein the deposition gas comprises the chlorine gas and the silicon source, and the deposition process is an epitaxy deposition process.

11. The method of claim 2, wherein the etching gas, the deposition gas, and the chamber clean gas each comprises silane and chlorine gas.

12. A method for forming a silicon-containing material on a substrate surface, comprising:
 positioning a substrate comprising a silicon material containing a contaminant within a process chamber;
 exposing the substrate to an etching gas comprising a silicon source at a temperature of less than about 800° C. during an etching process to remove the contaminant; and
 exposing the process chamber to a chamber clean gas comprising chlorine gas and the silicon source during a chamber clean process.

13. The method of claim 12, wherein the substrate is removed from the process chamber prior to starting the chamber clean process.

14. The method of claim 12, wherein the chamber clean gas further comprises nitrogen, the silicon source comprises silane, and the process chamber is heated to a temperature of about 60020 C. or higher during the chamber clean process.

15. The method of claim 12, wherein the temperature of the process chamber during the chamber clean process is within a range from about 700° C. to about 900° C. and the process chamber is at a pressure of about 760 Torr or less.

16. The method of claim 12, further comprising exposing the silicon material to a deposition gas comprising the silicon source during a deposition process subsequent to the etching process and prior to the chamber clean process.

17. The method of claim 16, wherein the etchant gas comprises chlorine gas and the silicon material contains a smooth surface having a roughness of about 1 nm RMS or less after the etching process.

18. The method of claim 16, wherein the deposition process is an epitaxy deposition process.

19. The method of claim 16, wherein the etching gas, the deposition gas, and the chamber clean gas each comprises silane.

20. A method for forming a silicon-containing material on a substrate surface, comprising:
 positioning a substrate comprising a silicon material containing a contaminant within a process chamber;
 exposing the substrate to an etching gas comprising chlorine gas and a silicon source at a temperature of less than about 800° C. during an etching process to remove the contaminant;
 exposing the substrate to a deposition gas comprising the silicon source during an epitaxial deposition process;
 removing the substrate from the process chamber; and
 exposing the process chamber to a chamber clean gas comprising an etchant gas and the silicon source during a chamber clean process.

21. The method of claim 20, wherein the chamber clean gas comprises chlorine gas, and the silicon source comprises silane.

22. A method for forming a silicon-containing material on a substrate surface, comprising:
 positioning a substrate comprising a silicon material containing a contaminant within a process chamber;
 exposing the substrate to an etching gas comprising chlorine gas and silane at a temperature of less than about 800° C. during an etching process to remove the contaminant;

exposing the substrate to a deposition gas comprising the chlorine gas and the silane during an epitaxial deposition process;

removing the substrate from the process chamber; and exposing the process chamber to a chamber clean gas comprising the chlorine gas and the silane during a chamber clean process.

23. The method of claim 22, wherein the etching process removes material at a rate of about 10 Å/min or less.

24. The method of claim 23, wherein the rate is about 2 Å/min or less.

25. The method of claim 22, wherein the etching process removes material at a rate within a range from about 200 Å/min to about 1,000 Å/min.

* * * * *

UNITED STATES PATENT AND TRADEMARK OFFICE
CERTIFICATE OF CORRECTION

PATENT NO.         : 8,093,154 B2
APPLICATION NO.    : 11/242613
DATED              : January 10, 2012
INVENTOR(S)        : Zojaji et al.

It is certified that error appears in the above-identified patent and that said Letters Patent is hereby corrected as shown below:

In the Claims:

Column 15, Claim 7, Line 54, please delete "chamber clean process";

Column 15, Claim 7, Line 55, please insert --chamber clean process-- before is;

Column 16, Claim 14, Line 22, please delete "60020 C" and insert --600° C-- therefor.

Signed and Sealed this
Twentieth Day of March, 2012

David J. Kappos
*Director of the United States Patent and Trademark Office*